United States Patent
Liang et al.

(10) Patent No.: US 8,921,138 B2
(45) Date of Patent: Dec. 30, 2014

(54) METHOD OF MANUFACTURING MULTI-WAVELENGTHS DISTRIBUTED FEEDBACK (DFB) LASER ARRAY INCLUDING TOP SEPARATE CONFINEMENT LAYER HAVING DIFFERENT THICKNESS LASER UNITS ON THE QUANTUM-WELL LAYER GROWN BY SELECTIVE AREA EPITAXIAL GROWTH

(71) Applicant: Institute of Semiconductors, Chinese Academy of Sciences, Beijing (CN)

(72) Inventors: Song Liang, Beijing (CN); Can Zhang, Beijing (CN); Hongliang Zhu, Beijing (CN); Wei Wang, Beijing (CN)

(73) Assignee: Institute of Semiconductors, Chinese Academy of Sciences, Beijing (CN)

( * ) Notice: Subject to any disclaimer, the term of this patent is extended or adjusted under 35 U.S.C. 154(b) by 0 days.

(21) Appl. No.: 14/011,150

(22) Filed: Aug. 27, 2013

(65) Prior Publication Data

US 2014/0065748 A1 Mar. 6, 2014

(30) Foreign Application Priority Data

Aug. 31, 2012 (CN) .......................... 2012 1 0319231

(51) Int. Cl.
| | | |
|---|---|---|
| *H01L 21/00* | (2006.01) | |
| *H01S 5/34* | (2006.01) | |
| *H01S 5/40* | (2006.01) | |
| *H01S 5/20* | (2006.01) | |
| *H01S 5/12* | (2006.01) | |

(52) U.S. Cl.
CPC ............ *H01S 5/3407* (2013.01); *H01S 5/4087* (2013.01); *H01S 5/2077* (2013.01); *H01S 5/12* (2013.01)

USPC ............ 438/34; 257/79; 257/E21.09; 438/46; 372/96

(58) Field of Classification Search
CPC ....... H01S 5/4087; H01S 5/2077; H01S 5/12; H01L 33/30
USPC ...................... 372/45, 96, 50.11; 257/E21.09, 257/E33.026, 21, 131; 438/46, 478
See application file for complete search history.

(56) References Cited

U.S. PATENT DOCUMENTS

| | | | |
|---|---|---|---|
| 6,560,262 B1 * | 5/2003 | Alam et al. ................... | 372/50.1 |
| 2002/0101896 A1 * | 8/2002 | Funabashi et al. .............. | 372/45 |
| 2003/0008426 A1 * | 1/2003 | Kise et al. ........................ | 438/22 |
| 2010/0081225 A1 * | 4/2010 | Song et al. ....................... | 438/46 |
| 2013/0003771 A1 * | 1/2013 | Kwon et al. ................ | 372/50.11 |

* cited by examiner

*Primary Examiner* — Davienne Monbleau
*Assistant Examiner* — Changhyun Yi
(74) *Attorney, Agent, or Firm* — Workman Nydegger

(57) ABSTRACT

A method for manufacturing a distributed feedback laser array includes: forming a bottom separate confinement layer on a substrate; forming a quantum-well layer on the bottom separate confinement layer; forming a selective-area epitaxial dielectric mask pattern on the quantum-well layer; forming a top separate confinement layer on the quantum-well layer through selective-area epitaxial growth using the selective-area epitaxial dielectric mask pattern, the top separate confinement layer having different thicknesses for different laser units; removing the selective-area epitaxial dielectric mask pattern; forming an optical grating on the top separate confinement layer; and growing a contact layer on the optical grating. The present disclosure achieves different emission wavelengths for different laser units without significantly affect emission performance of the quantum-well material.

6 Claims, 4 Drawing Sheets

METHOD OF MANUFACTURING MULTI-WAVELENGTHS DISTRIBUTED FEEDBACK (DFB) LASER ARRAY INCLUDING TOP SEPARATE CONFINEMENT LAYER HAVING DIFFERENT THICKNESS LASER UNITS ON THE QUANTUM-WELL LAYER GROWN BY SELECTIVE AREA EPITAXIAL GROWTH

CROSS-REFERENCE TO RELATED APPLICATIONS

This application claims priority to Chinese Application No. 201210319231.X, filed Aug. 31, 2012, which is incorporated herein by specific reference in its entirety.

TECHNICAL FIELD

The present disclosure relates to optoelectronic devices, and particularly to a method for manufacturing a distributed feedback (DFB) laser array.

BACKGROUND

Multi-wavelength laser devices are widely used in modern wavelength division multiplexing (WDM) optical communication systems. A single-chip integrated multi-wavelength laser array has a wide application prospect in the WDM systems due to its compact size, low loss in both optical and electrical connections, high stability, and high reliability. There have been developed a number of methods for manufacturing the single-chip integrated multi-wavelength laser array, including electron-beam lithography, multi-step holographic exposure, sampling grating, and selective area epitaxial growth (SAG), etc.

Among these methods, fabrication of the single-chip integrated multi-wavelength laser array using the SAG technique has attracted increasing attention due to its simple process. An existing solution for manufacturing the single-chip integrated multi-wavelength laser array using the SAG technique includes, inter alia, forming an SAG mask pattern on a substrate; SAG of active-region materials, which consist a top separate confinement layer (SCL), a bottom SCL, and a multi-quantum-well layer; forming a grating on the top SCL; and growth of a contact layer. According to this solution, the thickness of the active-region materials can be varied using the SAG so that the materials for different laser units in the array may have different effective diffraction indexes, which in turn results in different lasing wavelengths for the different laser units. A drawback of this solution is that in addition to the effective refractive indexes of the materials, emission wavelengths of the quantum wells also vary with the thickness of the materials. The emission wavelength of the quantum-well material is sensitive to its thickness, causing the variation of the emission wavelengths of the quantum well with the quantum well thickness to be much more rapid than Bragg wavelengths of the DFB lasers. As a result, the Bragg wavelengths of some laser units will deviate from the peak gain value of the quantum-well material, thereby deteriorating its single-mode characteristic. Also, quality of the quantum-well material may degrade seriously if the thickness thereof is excessively increased because the quantum-well material typically has a large strain.

SUMMARY

The present disclosure aims to provide, among others, a method for manufacturing a distributed feedback (DFB) laser array using selective-area epitaxial growth, which may achieve different emission wavelengths for different laser units without significantly affecting the optical properties of the quantum-well material thereof.

According to an aspect of the present disclosure, a method for manufacturing a DFB laser array comprises: forming a bottom separate confinement layer on a substrate; forming a quantum-well layer on the bottom separate confinement layer; forming a selective-area epitaxial dielectric mask pattern on the quantum-well layer; forming a top separate confinement layer on the quantum-well layer through selective-area epitaxial growth using the selective-area epitaxial dielectric mask pattern, the top separate confinement layer having different thicknesses for different laser units; removing the selective-area epitaxial dielectric mask pattern; forming an optical grating on the top separate confinement layer; and growing a contact layer on the optical grating.

Optionally, the selective-area epitaxial dielectric mask pattern may comprise a plurality of mask pairs each corresponding to a respective laser unit, wherein a space between two adjacent mask pairs is the same as that between two corresponding laser units; and for the respective mask pairs corresponding to the different laser units, a space between two masks of each mask pair increases or decreases progressively or a width of each of the two masks increases or decreases progressively.

Optionally, the bottom separate confinement layer and the quantum-well layer may be grown by epitaxial growth.

According to another aspect of the present disclosure, a method for manufacturing a DFB laser array comprises: forming a selective-area epitaxial dielectric mask pattern on a substrate; forming a bottom separate confinement layer through selective-area epitaxial growth using the selective-area epitaxial dielectric mask pattern, the bottom separate confinement layer having different thicknesses for different laser units; removing the selective-area epitaxial dielectric mask pattern; forming a quantum-well layer on the bottom separate confinement layer; forming a top separate confinement layer on the quantum-well layer layer; forming an optical grating on the top separate confinement layer; and growing a contact layer on the optical grating.

Optionally, the selective-area epitaxial dielectric mask pattern may comprise a plurality of mask pairs each corresponding to a respective laser unit, wherein a space between two adjacent mask pairs is the same as that between two corresponding laser units; and for the respective mask pairs corresponding to the different laser units, a space between two masks of each mask pair increases or decreases progressively or a width of each of the two masks increases or decreases progressively.

Optionally, the bottom separate confinement layer and the quantum-well layer may be grown by epitaxial growth.

According to the present disclosure, only the thickness of the top separate confinement layer or the bottom separate confinement layer of the laser unit is varied using the SAG while the thickness of the other layers are kept constant. In this way, materials of different laser units of the array may have different effective refractive indexes, whereby different laser units may have different emission wavelengths and similar grating periods. Meanwhile, the emission performance of the quantum-well material will not be affected, which is advantageous in manufacturing the multi-wavelength laser array with high quality.

BRIEF DESCRIPTION OF THE DRAWINGS

Embodiments of the present disclosure will be further described in connection with specific embodiments with reference to accompanied drawings, in which.

DETAILED DESCRIPTION

FIGS. 1, 3, 5, and 6 schematically show a method for manufacturing a distributed feedback laser array using selective-area epitaxial growth according to a first embodiment of the present disclosure. The method is exemplarily described to include the following steps.

In step 1, a bottom separate confinement layer 2 and a quantum-well layer 3 are formed in sequence on a substrate 1. The substrate 1 may comprise any one of GaAs, InP, GaN, SiC, Si, or any other III-V group or II-VI group materials.

Figure 1:
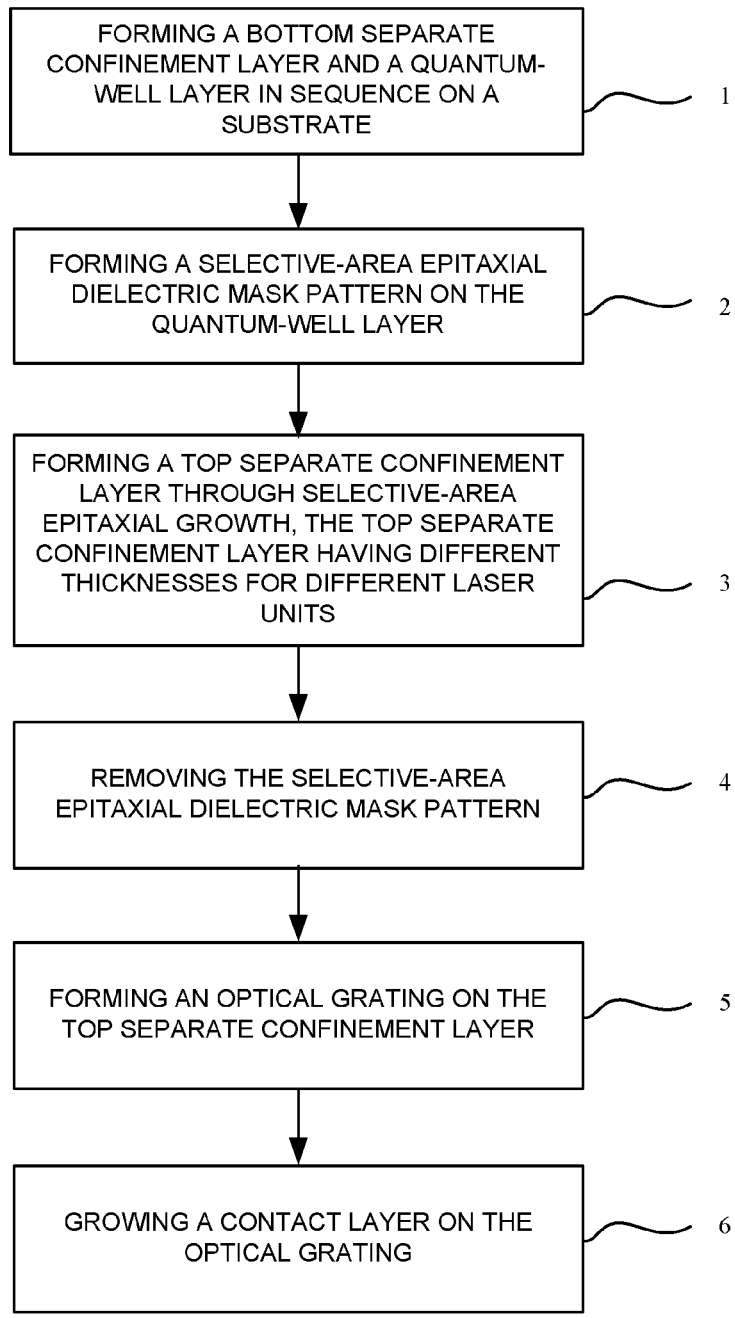
FIG. 1 schematically shows a flow diagram of a method for manufacturing a distributed feedback laser array using selective-area epitaxial growth according to a first embodiment of the present disclosure.
Figure 2:
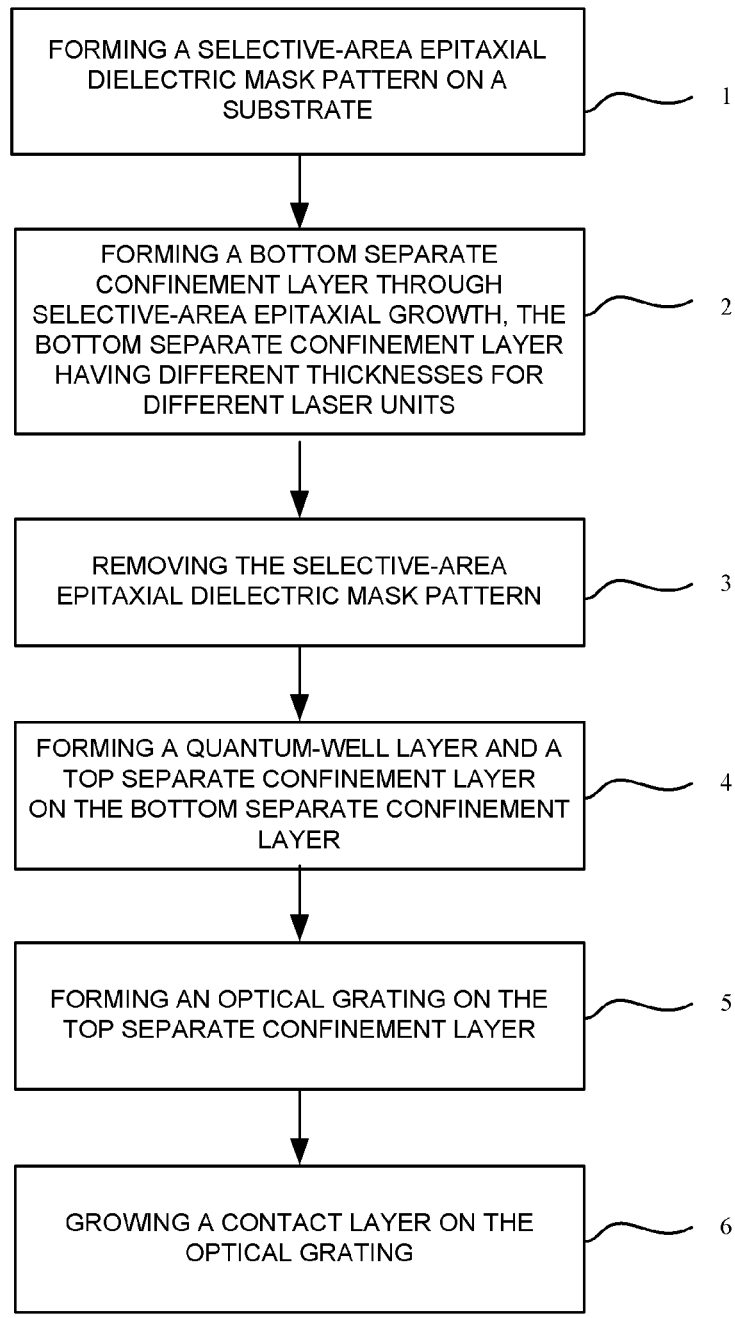
FIG. 2 schematically shows a flow diagram of a method for manufacturing a distributed feedback laser array using selective-area epitaxial growth according to a second embodiment of the present disclosure.
Figure 3:
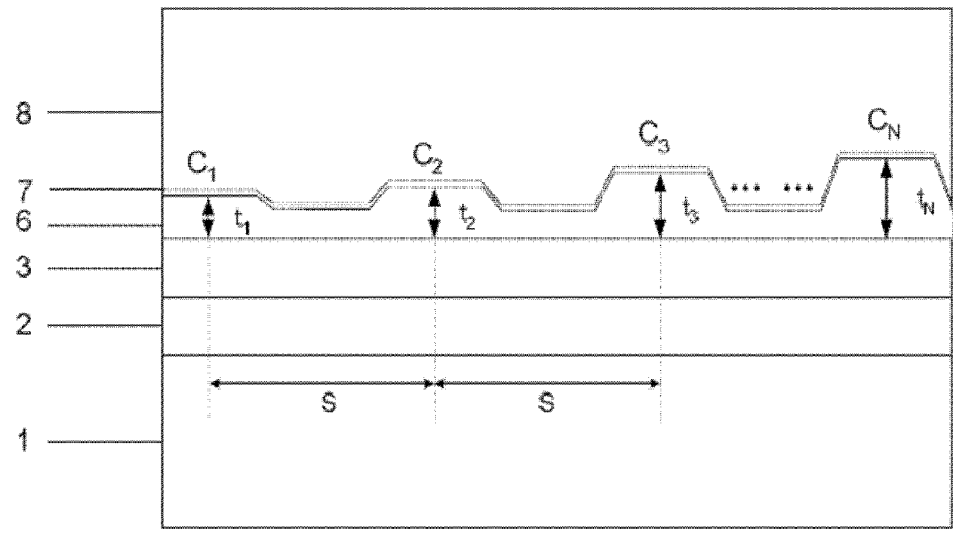
FIG. 3 schematically shows a structural sectional view of the distributed feedback laser array manufactured according to the first embodiment of the present disclosure.
Figure 5:
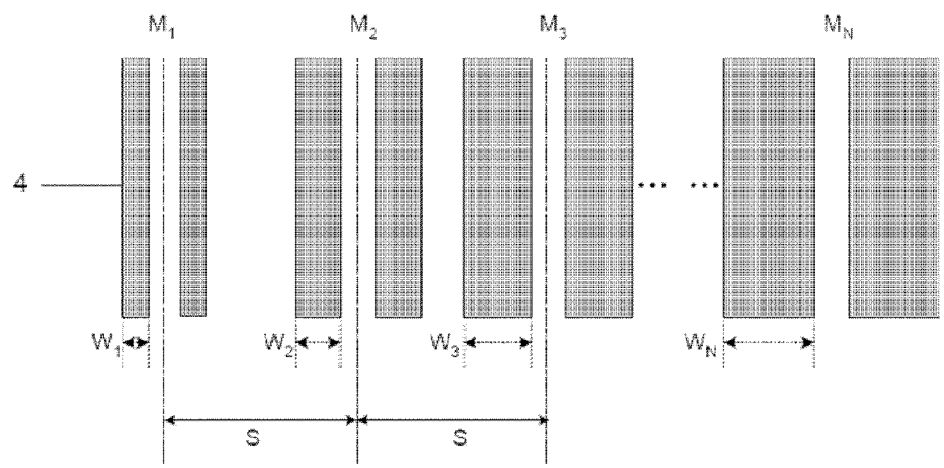
FIG. 5 schematically shows a dielectric mask pattern with a constant space between two masks in each mask pair and progressively-changed mask widths for each mask pair.
Figure 6:
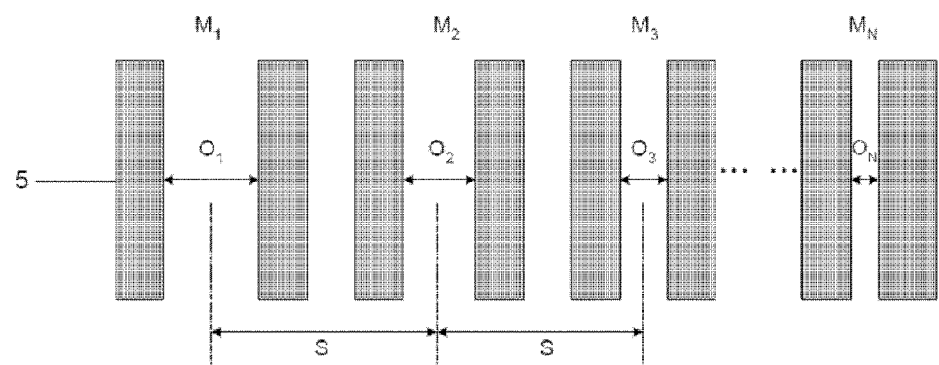
FIG. 6 schematically shows a dielectric mask pattern with a constant mask width and progressively-changed space between two masks in each mask pair for each mask pair.

In step 2, a selective-area epitaxial dielectric mask pattern 4 (shown in FIG. 5) or 5 (shown in FIG. 6) is formed on the quantum-well layer 3. The mask pattern 4 or 5 comprises a plurality of mask pairs having a same period (S) as that of laser units as shown in FIG. 3. The mask pairs in the mask pattern 4 as shown in FIG. 5 have a constant space between two masks in each mask pair and a progressively-increasing mask width for each mask pair. For example, mask pairs $M_1$, $M_2$, $M_3$, ..., and $M_N$ have respective mask widths $W_1$, $W_2$, $W_3$, ..., and $W_N$ satisfying $W_1<W_2<W_3<, ... <W_N$. The mask pattern 5 as shown in FIG. 6 has a constant mask width and a progressively-decreasing space between two masks for each mask pair. For example, the spaces $O_1$, $O_2$, $O_3$, ..., and $O_N$ between respective two masks in the mask pairs $M_1$, $M_2$, $M_3$, ..., and $M_N$ satisfy $O_1>O_2>O_3>, ... >O_N$. The selective-area epitaxial dielectric mask pattern 4 may comprise $SiO_2$ or $Si_3N_4$.

In step 3, a top separate confinement layer 6 is grown using the selective-area epitaxial dielectric mask pattern 4 through selective-area epitaxial growth to have different thicknesses for different laser units.

In step 4, the selective-area epitaxial dielectric mask pattern 4 or 5 is removed.

In step 5, an optical grating 7 is formed on the top separate confinement layer 6.

In step 6, a contact layer 8 is grown on the optical grating 7.

FIGS. 2, 4, 5, and 6 schematically show a method for manufacturing a distributed feedback laser array using selective-area epitaxial growth according to a second embodiment of the present disclosure. The method is exemplarily described to include the following steps.

Figure 4:
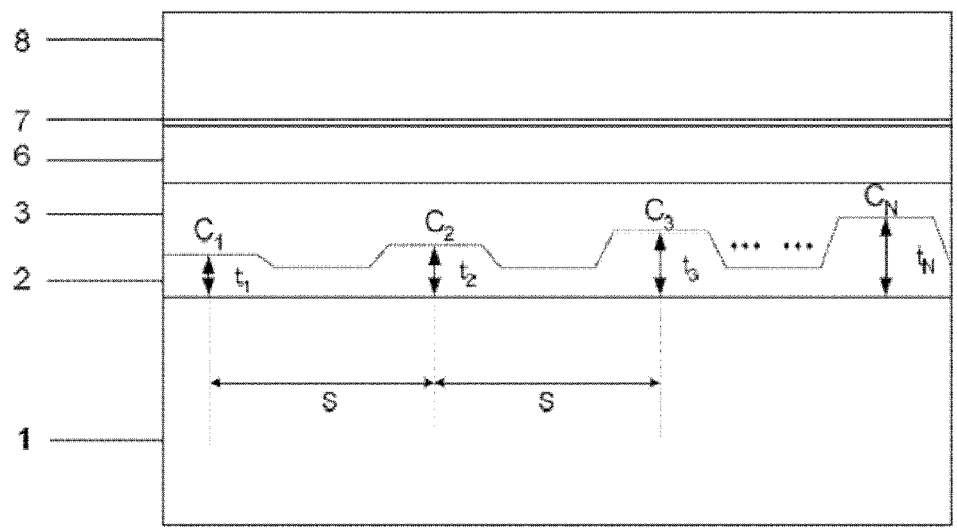
FIG. 4 schematically shows structural sectional view of the distributed feedback laser array manufactured according to the second embodiment of the present disclosure.

In step 1, a selective-area epitaxial dielectric mask pattern 4 (shown in FIG. 5) or 5 (shown in FIG. 6) is formed on a substrate 1. The substrate 1 may comprise any one of GaAs, InP, GaN, SiC, Si, or any other III-V group or II-VI group materials. The mask pattern 4 or 5 comprises a plurality of mask pairs having a same period (S) as that of laser units as shown in FIG. 4. The mask pairs in the mask pattern 4 as shown in FIG. 5 have a constant space between two masks in each mask pair and a progressively-increasing mask width for each mask pair. For example, mask pairs $M_1$, $M_2$, $M_3$, ..., and $M_N$ have respective mask widths $W_1$, $W_2$, $W_3$, ..., and $W_N$ satisfying $W_1<W_2<W_3<, ... <W_N$. The mask pattern 5 as shown in FIG. 6 has a constant mask width and a progressively-decreasing space between two masks for each mask pair. For example, the spaces $O_1$, $O_2$, $O_3$, ..., and $O_N$ between respective two masks in the mask pairs $M_1$, $M_2$, $M_3$, ..., and $M_N$ satisfy $O_1>O_2>O_3>, ... >O_N$. The selective-area epitaxial dielectric mask pattern 4 may comprise $SiO_2$ or $Si_3N_4$.

In step 2, a bottom separate confinement layer 2 is grown using the selective-area epitaxial dielectric mask pattern 4 through selective-area epitaxial growth to have different thicknesses for different laser units.

In step 3, the selective-area epitaxial dielectric mask pattern 4 or 5 is removed.

In step 4, a quantum-well layer 3 and a top separate confinement layer 6 are grown in sequence on the bottom separate confinement layer 2.

In step 5, an optical grating 7 is formed on the top separate confinement layer 6.

In step 6, a contact layer 8 is grown on the optical grating 7.

During the SAG, nucleation and growth of material will occur only in area between mask pairs of the selective-area epitaxial dielectric mask pattern 4 instead of on surfaces of the selective-area epitaxial dielectric mask pattern 4. Accordingly, besides a vertical concentration gradient which controls the growth of the epitaxial material, the reactants for material growth have also a lateral concentration gradient caused by the repelling effect of the mask pairs on a semiconductor surface. As a result, the thickness of the material in the selective growth area between the mask pairs increases. The amount of the increase of the material thickness increases as the mask width of the mask pairs increases. Also, the amount of the increase of the material thickness increases as the space between the two masks for each mask pair decreases. As shown in FIG. 3, when the SAG is performed using the dielectric mask as shown in FIG. 5 or 6, for successive laser units $C_1$, $C_2$, $C_3$, ..., $C_N$, the thickness of the top separate confinement layer 6 increases progressively. As shown in FIG. 4, for successive laser units $C_1$, $C_2$, $C_3$, ..., $C_N$, the thickness of the bottom separate confinement layer 2 increases progressively, i.e., $t_1<t_2<t_3<, ... <t_N$. Accordingly, effective refractive indexes of the material of the laser units in the array satisfy $n_{eff1}<n_{eff2}<n_{eff3}< ... <n_{effN}$.

If the emission wavelength of the distributed feedback laser is denoted as $\lambda$, the period of the optical grating is denoted as $\Lambda$, $\lambda=2n_{eff}\Lambda$. Thus, different laser units will have different emission wavelengths due to the progressive change of the top or bottom separate confinement layer thereof, i.e., $\lambda_1<\lambda_2<\lambda_3< ... <\lambda_N$. In this way, the multi-wavelength laser array can be manufactured. The SAG is performed after the growth of the quantum-well layer, which results in that only the top separate confinement layer has the thickness variation, thus avoiding disadvantageous influence on the quality of other material layers including the quantum-well layer.

According to an embodiment of the present disclosure, the contact layer 8 may contain a cladding layer and a highly doped layer for forming the electrode.

The foregoing illustrates exemplary embodiments of the present disclosure. However, the scope of the present disclosure is not limited thereto. Any modifications or substitutions apparent to one of ordinary skill in the art will fall within the scope of the present disclosure, which is defined by the attached claims.

We claim:

1. A method for manufacturing a distributed feedback laser array, comprising:
- forming a bottom separate confinement layer on a substrate;
- forming a quantum-well layer on the bottom separate confinement layer;
- forming a selective-area epitaxial dielectric mask pattern on the quantum-well layer;
- forming a top separate confinement layer on the quantum-well layer through selective-area epitaxial growth using the selective-area epitaxial dielectric mask pattern, the top separate confinement layer having different thicknesses for different laser units;
- removing the selective-area epitaxial dielectric mask pattern;
- forming an optical grating on the top separate confinement layer; and
- growing a contact layer on the optical grating.

2. The method according to claim 1, wherein the selective-area epitaxial dielectric mask pattern comprises a plurality of mask pairs each corresponding to a respective laser unit, wherein a space between two adjacent mask pairs is the same as that between two corresponding laser units; and for the respective mask pairs corresponding to the different laser units, a space between two masks of each mask pair increases or decreases progressively or a width of each of the two masks increases or decreases progressively.

3. The method according to claim 1, the bottom separate confinement layer and the quantum-well layer are grown by epitaxial growth.

4. A method for manufacturing a distributed feedback laser array, comprising:
- forming a selective-area epitaxial dielectric mask pattern on a substrate;
- forming a bottom separate confinement layer through selective-area epitaxial growth using the selective-area epitaxial dielectric mask pattern, the bottom separate confinement layer having different thicknesses for different laser units;
- removing the selective-area epitaxial dielectric mask pattern;
- forming a quantum-well layer on the bottom separate confinement layer;
- forming a top separate confinement layer on the quantum-well layer;
- forming an optical grating on the top separate confinement layer; and
- growing a contact layer on the optical grating.

5. The method according to claim 4, wherein the selective-area epitaxial dielectric mask pattern comprises a plurality of mask pairs each corresponding to a respective laser unit, wherein a space between two adjacent mask pairs is the same as that between two corresponding laser units; and for the respective mask pairs corresponding to the different laser units, a space between two masks of each mask pair increases or decreases progressively or a width of each of the two masks increases or decreases progressively.

6. The method according to claim 4, wherein the bottom separate confinement layer and the quantum-well layer are grown by epitaxial growth.

* * * * *